United States Patent [19]

Ghosh

[11] Patent Number: 4,525,448
[45] Date of Patent: Jun. 25, 1985

[54] METHOD OF FABRICATING SUB-HALF-MICRON-SIZE GATES ON SEMICONDUCTOR SUBSTRATES

[75] Inventor: Chuni L. Ghosh, Roanoke, Va.

[73] Assignee: International Telephone and Telegraph Corporation, New York, N.Y.

[21] Appl. No.: 568,753

[22] Filed: Jan. 6, 1984

[51] Int. Cl.³ .............................................. G03C 5/00
[52] U.S. Cl. .................................. 430/314; 430/315; 430/317; 430/318; 430/323; 430/324; 430/329; 430/312
[58] Field of Search ............... 430/311, 313, 314, 315, 430/319, 323, 324, 329, 317, 318, 312

[56] References Cited

U.S. PATENT DOCUMENTS 3,849,136 11/1974 Grebe ................................. 430/314
4,265,934 5/1981 Ladd, Jr. ............................. 427/84

FOREIGN PATENT DOCUMENTS 55-41728 3/1980 Japan .................................. 430/315

OTHER PUBLICATIONS

Chao et al., Conference: International Electron Devices Meeting. Washington, D.C., USA (Dec. 7-9, 1981), pp. 92-95.

Primary Examiner—John E. Kitta
Assistant Examiner—José G. Dees
Attorney, Agent, or Firm—John T. O'Halloran; Peter R. Ruzek

[57] ABSTRACT

A method of fabricating a very small-size gate on a semiconductor substrate includes covering the substrate with a photoresist layer, masking an area of the photoresist layer that has a size exceeding the desired size of the gate, subjecting the photoresist layer to overexposure so that the size of the unaffected area is reduced to the desired size, removing the overexposed region of the photoresist layer, providing a protective coating on such region, clearing the unaffected photoresist material out of the area occupied thereby, and depositing gate material at least in the thus obtained recess. The gate material may be deposited over the protective coating, in which case the zone at which the gate is to remain is protected by unexposed photoresist material and the remainder of the gate material is removed from the protective coating. In the alternative, an additional photoresist layer is deposited over the protective coating and is exposed only at the zone of the recess, whereupon the exposed photoresist is removed and the metallic gate material is applied over the unexposed photoresist left behind, as well as into the zone vacated by the exposed photoresist of the additional layer. Then, the gate material and the unexposed additional photoresist layer are removed, leaving the gate behind. In each instance, the protective coating is also removed.

13 Claims, 9 Drawing Figures

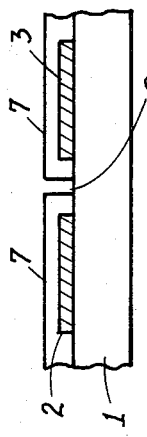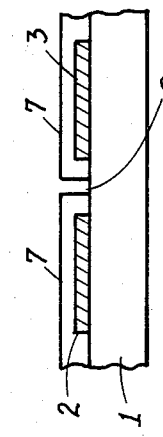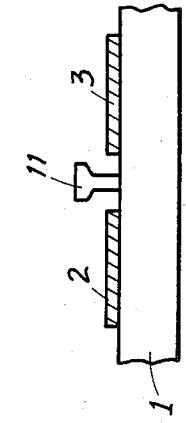
FIG. 1a  FIG. 1b  FIG. 1c
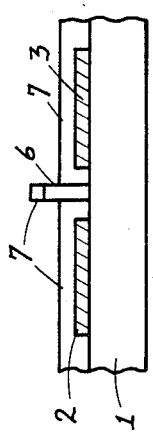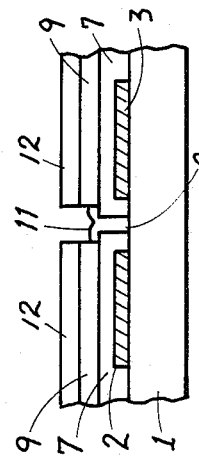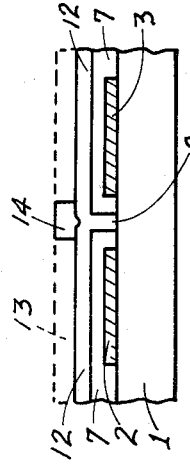
FIG. 2a  FIG. 2b  FIG. 2c
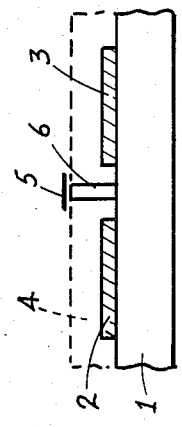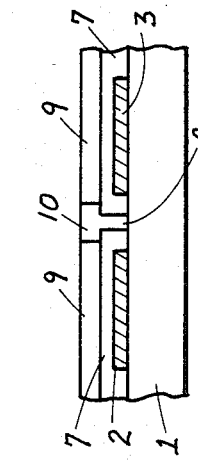
FIG. 3a  FIG. 3b  FIG. 3c

METHOD OF FABRICATING SUB-HALF-MICRON-SIZE GATES ON SEMICONDUCTOR SUBSTRATES

BACKGROUND OF THE INVENTION

The present invention relates to production of semiconductor devices, especially of MESFETs, in general, and more particularly to a method of fabricating sub-half-micron-size gates on semiconductor substrates.

There are already known various methods of fabricating semiconductor devices. Many of these methods employ sequential deposition of layers of various materials, followed by a subsequent removal of at least portions of at least some of such deposited layers. In many instances, such processes involve, during one stage or another, the application of a photoresist layer to the underlying substrate or layers or formations already present thereon, exposure of selected regions of the photoresist layer to light, removal of the exposed regions of the photoresist layer, and application of the next successive layer over the remainder of the photoresist layer and the regions uncovered by the removal of the exposed photoresist layer therefrom. However, experience has shown that there is a practical limit on the sizes (that is, on the dimensions) of the areas of the photoresist layer that can be protected from exposure to light by masking the same. This limit lies in the vicinity of one micron and, using current masking techniques, it is almost impossible to expose, or leave unexposed, areas of the photoresist layer where the size of such areas, that is, at least one dimension thereof as considered in the plane of the support surface of the substrate, is less than half a micron, with any degree of assurance that the desired area of the photoresist layer will actually be exposed, or prevented from being exposed, to light.

Yet, there is a pronounced desire in the field of producing semiconductor devices, such as MESFET's, to fabricate gate contacts (hereinafter referred to as gates) at least one dimension of which less than half a micron, such as in the region of 0.2 to 0.25 micron, at least at its region of contact with the underlying substrate since, as experience has shown, semiconductor devices equipped with such relatively small-sized gates are capable of operating at higher frequencies than similar semiconductor devices with larger-size gates, at very low noise levels. Since, as mentioned before, it is very difficult if not impossible to fabricate such small-area gates by resorting to the conventional masking techniques, they are being currently produced by electron beam lithography. However, this method requires relatively expensive equipment and, consequently, the semiconductor devices produced by this technique are quite expensive.

SUMMARY OF THE INVENTION

Accordingly, it is a general object of the present invention to avoid the disadvantages of the prior art.

More particularly, it is an object of the present invention to provide a method of fabricating sub-half-micron-size gates on semiconductor substrates, which method does not exhibit the disadvantages of the above-mentioned electron beam lithography method.

It is still another object of the present invention to develop a method of fabricating of gates of the above type, which would be performable on standard equipment and in a relatively inexpensive way.

Yet another object of the present invention is to devise a method of the above type which is relatively simple and inexpensive to perform but which achieves excellent results nevertheless.

In pursuance of these objects and others which will be come apparent hereafter, one feature of the present invention resides in a method of providing on a support surface of a substrate a covering layer having at least one sub-half-micron-size recess therein, this method comprising the steps of covering at least a section of the support surface that includes the desired location of the recess with a photoresist layer; masking an area of the photoresist layer that covers the aforementioned location and has a size exceeding the desired size of the recess; subjecting the photoresist layer to overexposure with an attendant reduction in the size of the aforementioned area to the desired size; removing the photoresist layer from a region of the support surface surrounding the reduced-size area; applying the covering layer at least to the aforementioned region; and clearing the reduced size area to provide the recess.

A particular advantage of the above-mentioned approach is that, by using the expedient of subjecting the photoresist layer to overexposure, it is possible to use the standard and well-developed masking techniques, the results of which are totally predictable, without having to reduce the minimum feature size in the mask to less than about 1 micron. It will be appreciated that, by subjecting the photoresist layer to overexposure, the fringes of the masked area will also be affected and thus the size of the area unaffected by light during the overexposure of the photoresist layer will be effectively reduced with respect to the area that is masked. So, for instance, the respective dimension of the masked area (which would substantially equal the corresponding dimension of the unexposed photoresist material were it not for the overexposure) may be one micron and yet, after the overexposure, the corresponding dimension of the photoresist material unaffected by light may be about 0.2 micron. By controlling the degree of overexposure, it is possible to accurately determine the respective dimension of the unaffected area of the photoresist layer. Since the effect of the overexposure will be uniform, the outline of the unaffected area will correspond to that of the masked area, except for the predictable reduction in the respective dimensions. Hence, the mask can be easily designed in a conventional way in anticipation of the dimensional reduction during the overexposure, with dimensions of the masking areas thereof which are easily producible and reproducible by using optical mask manufacturing techniques, which is simpler and less expensive than the manufacture of masks with submicron line widths requiring electron beam technology for fabrication.

The method described above is particularly suited for use during the fabrication of sub-half-micron-size gates on semiconductor substrates, in that the gate metallization or similar gate material can be easily introduced into the cleared recess by using conventional techniques, such as sputtering or deposition from vapor state, or any other method known to those active in this field. For obvious reasons, no attempt is usually made to confine the deposition of the gate material either to the recess itself, or even to the recess and its immediate vicinity. In most instances, a complete layer of the gate material is deposited over the covering layer as the gate material is being deposited into the recess. According to the present invention, it is contemplated to provide for the removal of the gate material from the region surrounding the recess. It is proposed by the present invention to achieve such removal by etching. The etching may be of the reactive ion type, in which case the recess and/or its immediate vicinity is covered by an unexposed remainder of an additional photoresist layer to prevent etching of the material contained in the recess and/or in its immediate vicinity.

In many instances, it is desired that only the area of gate metallization which is close to and in contact with the substrate has the sub-half-micron-size, while the remainder of the gate that is remote from the substrate has a larger size, thus giving the gate a substantially mushroom-shaped cross-section. This may be desired, for instance, for improving the conductivity of the gate. This can be achieved in the manner discussed above in that the photoresist layer remainder that is effective during the etching operation covers not only the gate material contained in the recess but also the gate material deposited on the covering layer in the vicinity of the recess. However, a similar result can also be achieved by applying to the covering layer, prior to the deposition of the gate material, a photoresist layer, by exposing the photoresist layer to light at the area of the recess and slightly beyond the boundaries thereof, by removing the exposed photoresist so as to obtain a recessed zone at such exposed area, and by depositing the gate material not only into the recess but also into the aforementioned zone. Then, after the removal of the remainder of the photoresist and of the underlying covering layer, as well as the layer of the gate material located outside the recess and the zone, the gate will have the desired mushroom-shaped cross-section. The silicon dioxide or silicon nitride which may be present in the covering layer can be etched away by using hydrofluoric acid.

BRIEF DESCRIPTION OF THE DRAWING

Above-mentioned and other features and objects of this invention will become more apparent by reference to the following description taken in conjunction with the accompanying drawing, in which:

FIGS. 1a-1c are cross-sectional views of a semiconductor substrate and layers provided on a support surface thereof during different stages of the formation of a covering layer provided with a sub-half-micron-size recess in accordance with the present invention;

FIGS. 2a-2c are views similar to FIGS. 1a-1c but showing further stages of the method of the present invention subsequent to the formation of the recess and terminating with the completed gate; and FIGS. 3a-3c are views similar to FIGS. 2a-2c but showing a modified version of the subsequent stages of the method of the present invention.

DETAILED DESCRIPTION OF THE PREFERRED EMBODIMENTS

Referring now to the drawing to detail, and first to FIGS. 1a-1c, it may be seen that the reference numeral 1 has been used therein to identify a substrate which, as customary in the field of producing semiconductor devices, consists of a semiconductive material that includes doped regions of different conductivity types forming a source zone, a drain zone, and a gate zone therebetween. To establish electrical connections with the source and drain zones, a source metallization or electrode 2 and a drain metallization or electrode 3 are respectively applied, in a manner well known to those active in this field, over the source and drain zones, respectively. After the source and drain electrodes 2 and 3 have been applied, what is still needed is a gate metallization or electrode on the substrate 1 intermediate the source and drain electrodes 2 and 3. As mentioned before, it is very important in the fabrication of MESFETs to give the gate electrode a sub-half-micron size for higher frequency and low noise operation of the MESFET. According to the present invention, this sub-half-micron size of the gate electrode is obtained in the following manner:

First, as shown in FIG. 1a in phantom lines, a photoresist layer 4 is applied over the substrate 1 and the source and drain electrodes 2 and 3 previously applied thereto. Then, an area 5 of the photoresist layer 4 is masked in any conventional manner. The size of the masked area 5 is greater than the desired size of the gate electrode. It is to be understood that, when speaking about size, what is meant is at least one dimension as considered in a plane parallel to the support surface of the substrate 1 to which the source and drain electrodes 2 and 3 have previously been applied. However, the expression "size" is also intended to cover the possibility that more than one such dimension is involved. According to the present invention, the size of the masked area 5 may be, for instance, one micron or somewhat more. Under these circumstances, it is relatively easy to achieve the desired size of the masked area 5 by using conventional techniques.

After masking the area 5, the photoresist layer 4 is subjected to exposure to light in a bright field to an extent resulting in overexposure of the photoresist layer 4. Because of the overexposure of the photoresist layer 4, even the fringe portions of the photoresist layers which are situated underneath the masked area 5 become exposed, so that the unexposed area of the photoresist layer 4 is thus effectively reduced to the desired sub-half-micron size. Then, the photoresist layer 4 is developed and the exposed regions thereof removed, so that all that is left on the substrate 1 is a developed unexposed remainder 6 of the original photoresist layer 4.

In the next fabricating step, which is shown in FIG. 1b, a layer of silicon dioxide or silicon nitride is applied, for instance, by using the well-known evaporation technique, over the support surface of the substrate 1 and thus over the source and drain electrodes 2 and 3. Of course, some of the silicon oxide or silicon nitride will also become deposited on top of the photoresist remainder 6. The silicon oxide or silicon nitride layer is identified in its entirety by the reference numeral 7.

As shown in FIG. 1c, the next step in the fabrication of the semiconductor device involves the removal of the photoresist remainder 6, together with that portion of the silicon oxide or silicon nitride layer that covers the remainder 6, with possible additional removal of the silicon dioxide or silicon nitride from the immediate vicinity of the location of remainder 6. This removal can be accomplished, for instance, by resorting to conventional lift-off techniques. After the removal, a recess 8 is left behind in the otherwise continuous layer 7, this recess 8 penetrating all the way to the support surface of the substrate 1. Since the size of the photoresist remainder 6 was less than half a micron, preferably in a range between 0.2 and 0.25 micron, the size of the recess 8 will be of the same magnitude.

Turning now to FIGS. 2a-2c, it may be seen that they disclose further sub-half-micron-size gate fabrication steps taking place subsequent to the above discussed steps in accordance with one version of the process according to the present invention. As shown in FIG. 2a, this involves, first of all, the application of an additional photoresist layer 9 on top of the layer 7. As shown in FIG. 2a, the photoresist layer 9 is first applied as a continuous layer. Then, it is subjected to exposure to light in a dark field, with the result that an area 10 of a size exceeding that of the recess 8 is exposed. After developing the photoresist layer 9, only the exposed area 10 is removed, while the developed unexposed remainder of the photoresist layer 9 remains on top of the layer 7. Hence, a recessed zone that forms a continuation of the recess 8 and has a size exceeding that of the recess 8 is formed in the photoresist 9 to take place of the exposed area 10 of the photoresist layer 9.

Thereafter, as shown in FIG. 2b, gate metallization is applied on top of the substrate 1 and of the layers 7 and 9 previously applied thereto. The application of the gate metallization may be by resorting to the well-known techniques of evaporation or sputtering. During the application of the gate metallization, 9 gate electrode 11 is formed in the recess 8 and also partially in the recessed zone left empty by the removal of the exposed photoresist 10 from the photoresist layer 9. Since the size of the recessed zone exceeds the size of the recess 8, the gate electrode 11 will have a generally mushroom-shaped cross section. This particular cross section was found to be advantageous in terms of electrical conductivity. Simultaneously with the deposition of the gate electrode 11, an interrupted layer 12 of the gate metallization is also deposited on top of the photoresist layer 9.

FIG. 2c shows the final configuration of the semiconductor device obtained in accordance with the present invention. It may be seen that the layers 7, 9 and 12 are no longer present in the final semiconductor device. Such layers have been previously removed by resorting to well-known techniques, such as, for instance, first by using acetone to dissolve the photoresist layer 9 and lifting off the metal layer 12 and then removing layer 7 by etching using diluted hydrofluoric acid. Hence, after the removal of the layers 7, 9 and 12, all that is left is the substrate 1 with the source, drain and gate electrodes 2, 3 and 11 thereon.

FIGS. 3a–3c show an alternative succession of steps taking place subsequent to those steps described above in conjunction with FIGS. 1a–1c. This alternative approach uses the reactive ion etching technique. As shown in FIG. 3a, the gate metallization layer 12 is applied directly over the silicon dioxide or silicon nitride layer 7. This can be accomplished by using metal sputtering or metal evaporation technique. During the application of the metallic layer 12, the gate metallization also penetrates into the recess 8 and substantially fills the same.

Then, as shown in FIG. 3b, a photoresist layer 13 is applied over the metallization layer 12 and is exposed to light of a bright field such that only 9 zone 14 of the photoresist layer 13 remains unexposed. The size of the unexposed zone 14 exceeds the size of the recess 8. After the exposure and the development of the photoresist layer 13 and the removal of the exposed regions thereof, only the unexposed remainder zone 14 of the photoresist layer 13 remains on the layer 12 to cover the region of the recess 8 and its vicinity.

Thereafter, the intermediate product including the substrate 1, the source and drain electrodes 2 and 3, the silicon dioxide or silicon, nitride layer 7, the gate metallization 12 and the photoresist remainder zone 14 is subjected to reactive ion etching which is a well-known technique that need not be discussed here in any detail. Suffice it to say that this technique removes the gate metallization layer 12 from those regions that are not protected by the photoresist remainder zone 14. This means that the gate metallization will remain not only in the recess 8, but also, over the layer 7, at those regions of the latter which are covered by the photoresist remainder 14. Thereafter, the silicon dioxide or silicon nitride layer 7 is also removed, for instance by etching with dilute hydrofluoric acid, with the result being shown in FIG. 3c. It may be seen that this obtained configuration, which is very similar to that shown in FIG. 2c, again includes the substrate 1, the source and drain electrodes 2 and 3, and the gate electrode 11 disposed between the same. Because the recess 8 had a sub-half-micron size, the lower portion of the gate electrode 11 will again have a corresponding sub-half-micron size. On the other hand, since a photoresist remainder 14 has covered more than just the immediate region of the recess 8, the top portion of the gate electrode 11 again has a size exceeding that of the bottom portion, as desired. Thus, it may be seen that the gate electrode 11 obtained in this manner will again have the desired substantially mushroom-shaped cross section.

While I have described above the principles of my invention in connection with specific apparatus, it is to be clearly understood that this description is made only by way of example and not as a limitation to the scope of my invention as set forth in the objects thereof and in the accompanying claims.

I claim:

1. A method of fabricating a sub-half-micron-size gate on a support surface of a semiconductor substrate, comprising the steps of
    covering at least a section of the support surface that includes the desired location of the gate with a photoresist layer;
    masking an area of the photoresist layer that covers said location, such masked area having a size exceeding the desired size of the gate;
    subjecting the photoresist layer to overexposure with an attendant reduction in the size of said masked area down to said desired size of the gate
    removing the photoresist layer from a region of the support surface surrounding the reduced-size area;
    providing a protective coating at least on said region;
    clearing said reduced-size area to provide a recess in said protective coating; and
    depositing gate material at least in said recess.

2. The method as defined in claim 1, wherein said providing step includes depositing a layer of a silicon compound selected from the group consisting of silicon dioxide and silicon nitride.

3. The method as defined in claim 2, wherein said providing step further includes depositing a layer of photoresist over said silicon compound layer, exposing a zone of the photoresist layer that is at least coextensive with said reduced-size area to light, and removing the exposed photoresist from said zone.

4. The method as defined in claim 3, wherein said zone has a size exceeding that of said reduced-size area.

5. The method as defined in claim 4, wherein said depositing step includes depositing the gate material also in said zone to give the gate a substantially mushroom-shaped cross-section.

6. The method as defined in claim 1, wherein said clearing step includes lift-off of the photoresist material out of said recess.

7. The method as defined in claim 1, wherein said depositing step includes depositing the gate material in its evaporated state over the protective coating and in said recess.

8. The method as defined in claim 1, wherein said depositing step includes sputter-depositing the gate material.

9. The method as defined in claim 1, wherein said depositing step includes depositing the gate material both in said recess and over the protective coating; and further comprising the step of eliminating the protective coating from said region.

10. The method as defined in claim 9, wherein said eliminating step includes superimposing an etch-resistant layer on said reduced-size area, and etching the region outside said etch-resistant layer.

11. The method as defined in claim 10, wherein said superimposing step includes depositing the etch-resistant layer on a zone superimposed with said reduced-size area and having a size exceeding that of the latter to give the gate a substantially mushroom-shaped cross-section.

12. The method as defined in claim 10, wherein said etching includes reactive ion etching.

13. A method of providing on a support of a substrate a covering layer having at least one sub-half-micron-size recess therein, comprising the steps of covering at least a section of the support surface that includes the desired location of the recess with a photoresist layer;

masking an area of the photoresist layer that covers said location, such masked area having a size exceeding the desired size of the recess;

subjecting the photoresist layer to overexposure with an attendant reduction in the size of said masked area down to said desired size of the recess removing the photoresist layer from a region of the support surface surrounding the reduced-size area;

applying the covering layer at least to said region; and clearing said reduced-size area to provide the recess.

* * * * *

Notice of Adverse Decisions in Interference

In Interference No. 101,595, involving Patent No. 4,525,448, C. L. Ghosh, METHOD OF FABRICATING SUB-HALF-MICRON-SIZE GATES ON SEMICONDUCTOR SUBSTRATES, final judgment adverse to the patentee was rendered November 9, 1989, as to claims 1, 2, 6 and 13.
*(Official Gazette February 20, 1990)*